(12) United States Patent
Schu et al.

(10) Patent No.: US 8,311,090 B2
(45) Date of Patent: Nov. 13, 2012

(54) METHOD FOR ENCODING A FIRST AND A SECOND DATA WORD

(75) Inventors: Markus Schu, Munich (DE); Peter Rieder, Munich (DE); Marko Hahn, Neubiberg (DE); Guenter Scheffler, Munich (DE); Christian Tuschen, Munich (DE)

(73) Assignee: Entropic Communications, San Diego, CA (US)

( * ) Notice: Subject to any disclaimer, the term of this patent is extended or adjusted under 35 U.S.C. 154(b) by 1618 days.

(21) Appl. No.: 11/212,122

(22) Filed: Aug. 25, 2005

(65) Prior Publication Data
US 2006/0045178 A1    Mar. 2, 2006

(30) Foreign Application Priority Data
Aug. 26, 2004  (DE) .................. 10 2004 041 418

(51) Int. Cl.
*H04N 7/12*  (2006.01)
(52) U.S. Cl. .......... 375/240.01; 375/240.23; 375/240.24
(58) Field of Classification Search ............. 375/240.23, 375/240.24
See application file for complete search history.

(56) References Cited

U.S. PATENT DOCUMENTS

| | | |
|---|---|---|
| 4,682,152 A | 7/1987 | Okamoto et al. |
| 4,870,685 A | 9/1989 | Kadokawa et al. |
| 5,014,127 A | 5/1991 | Richards |
| 5,438,635 A | 8/1995 | Richards |
| 5,946,652 A | 8/1999 | Heddle |
| RE38,279 E | 10/2003 | Kataoka et al. |
| 2003/0161278 A1 | 8/2003 | Igura |
| 2004/0184537 A1 | 9/2004 | Geiger et al. |

FOREIGN PATENT DOCUMENTS

WO   WO 01/62009   8/2001 ................ 7/30

OTHER PUBLICATIONS

Proakis, John, "Digital Communications", 3rd Edition, McGraw-Hill, ISBN 0-07-051726-6, pp. 95-103.
Chen et al. "Near-Lossless Compression of Medical Images Through Entropy-Coded DPCM", IEEE Transactions on Medical Imaging, vol. 13, No. 3, Sep. 1994, New York, pp. 538-548.
Jens-Rainer Ohm "Digital Image Encoding: Representation, Compression and Transmission", Springer, 1995, ISBN 3-540,58579-6, pp. 246-261.
European Search Report, 2005.

*Primary Examiner* — Sath V Perungavoor
*Assistant Examiner* — Geepy Pe
(74) *Attorney, Agent, or Firm* — O'Shea Getz P.C.

(57) ABSTRACT

A method for encoding first and second data words, which may represent differential data values (e.g., luminance and chrominance difference data values), onto an encoded data word includes: assigning a first code word to a first approximation value for a first data value, and assigning a second code word to second approximation value for a second data value; mapping the first and the second code words onto respective first and second data segments of the encoded data word; determining a first difference value between the first data value and the first approximation value and determining a second difference value between the second data value and the second approximation value; and at least partial mapping a first difference data word representing the first difference value and/or a second difference data word representing the second difference value onto at least one additional data segment of the encoded data word.

31 Claims, 10 Drawing Sheets

FIG 1 PRIOR ART
a) 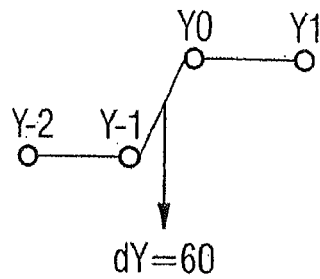 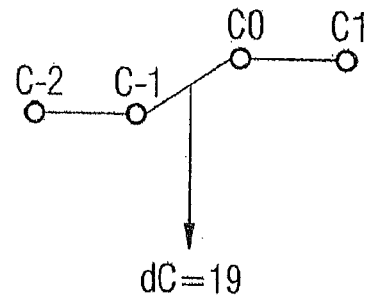
b)
| Luma-DPCM | |
|---|---|
| 0 | 000000 |
| 1 | 000001 |
| 2 | 000010 |
| ... | ... |
| 8 | 001000 |
| 9 | 001001 |
| 10 | 001010 |
| 12 | 001011 |
| ... | ... |
| 42 | 011010 |
| 44 | 011011 |
| 48 | 011100 |
| 52 | 011101 |
| 56 | 011110 |
| 60 | 011111 |
| 64 | 100000 |
| ... | ... |
| 124 | 101111 |
| 128 | 110001 |
| 136 | 110010 |
| 144 | 110011 |
| ... | ... |
| 240 | 111110 |
| 248 | 111111 |
| Chroma-DPCM | |
|---|---|
| 0 | 0000 |
| 1 | 0001 |
| 2 | 0010 |
| 4 | 0011 |
| 6 | 0100 |
| 8 | 0101 |
| 12 | 0110 |
| 16 | 0111 |
| 20 | 1000 |
| 24 | 1001 |
| 32 | 1010 |
| 48 | 1011 |
| 64 | 1100 |
| 96 | 1101 |
| 128 | 1110 |
| 192 | 1111 |
c) 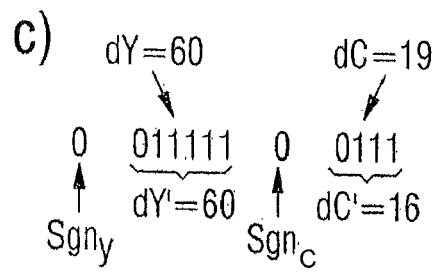

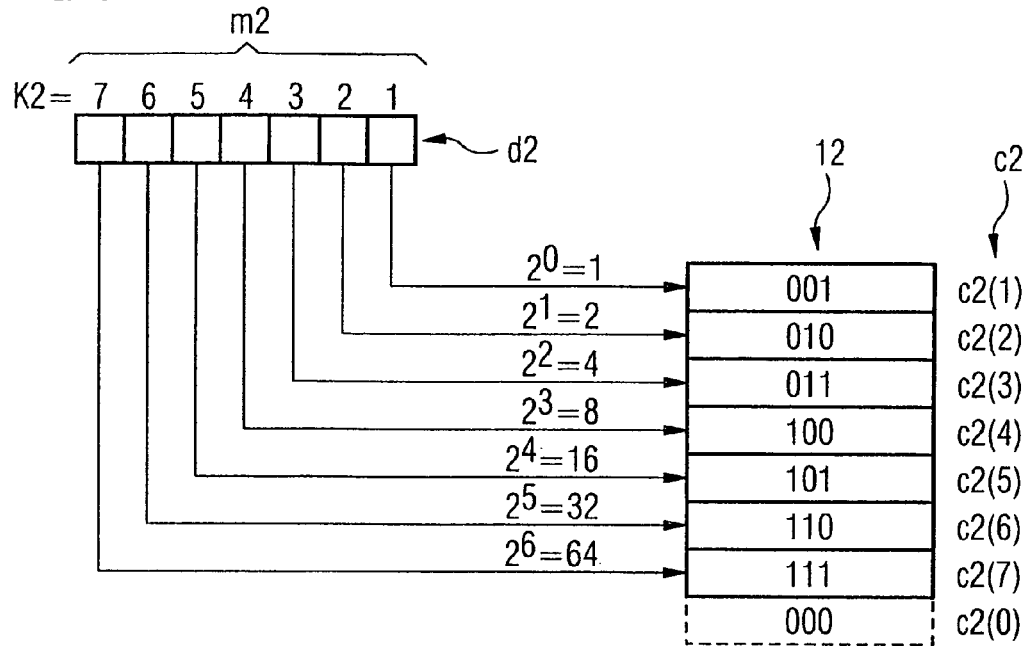
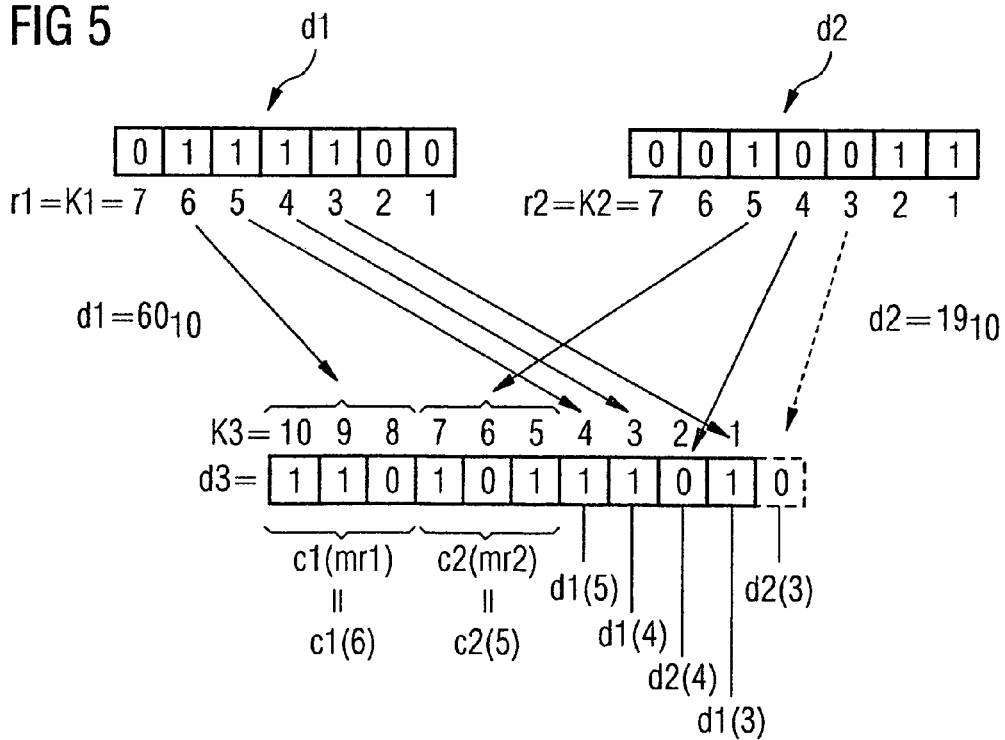

FIG 6
a)
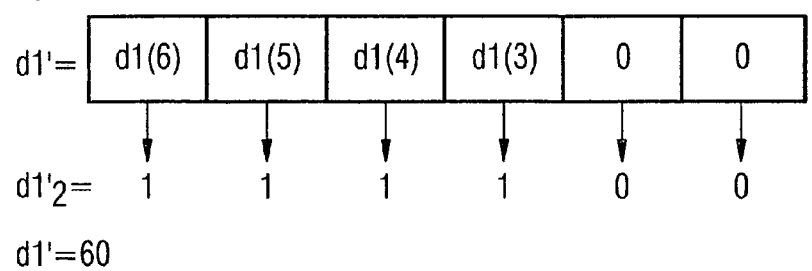
$d1' = 60$
b)
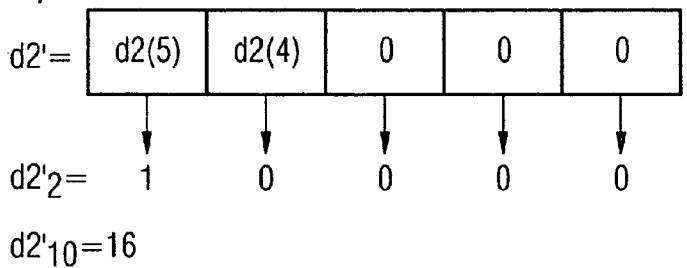
$d2'_{10} = 16$

FIG 8
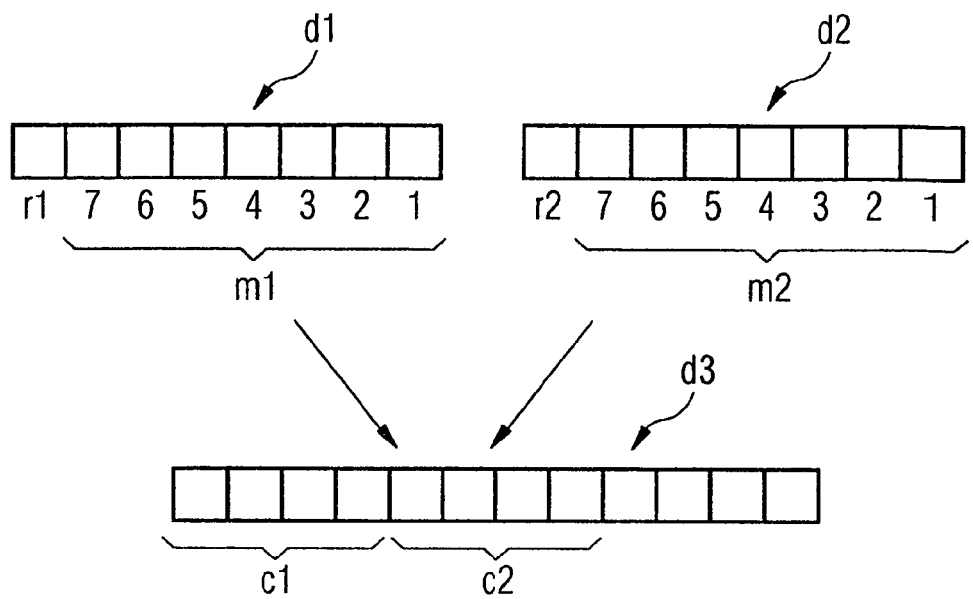
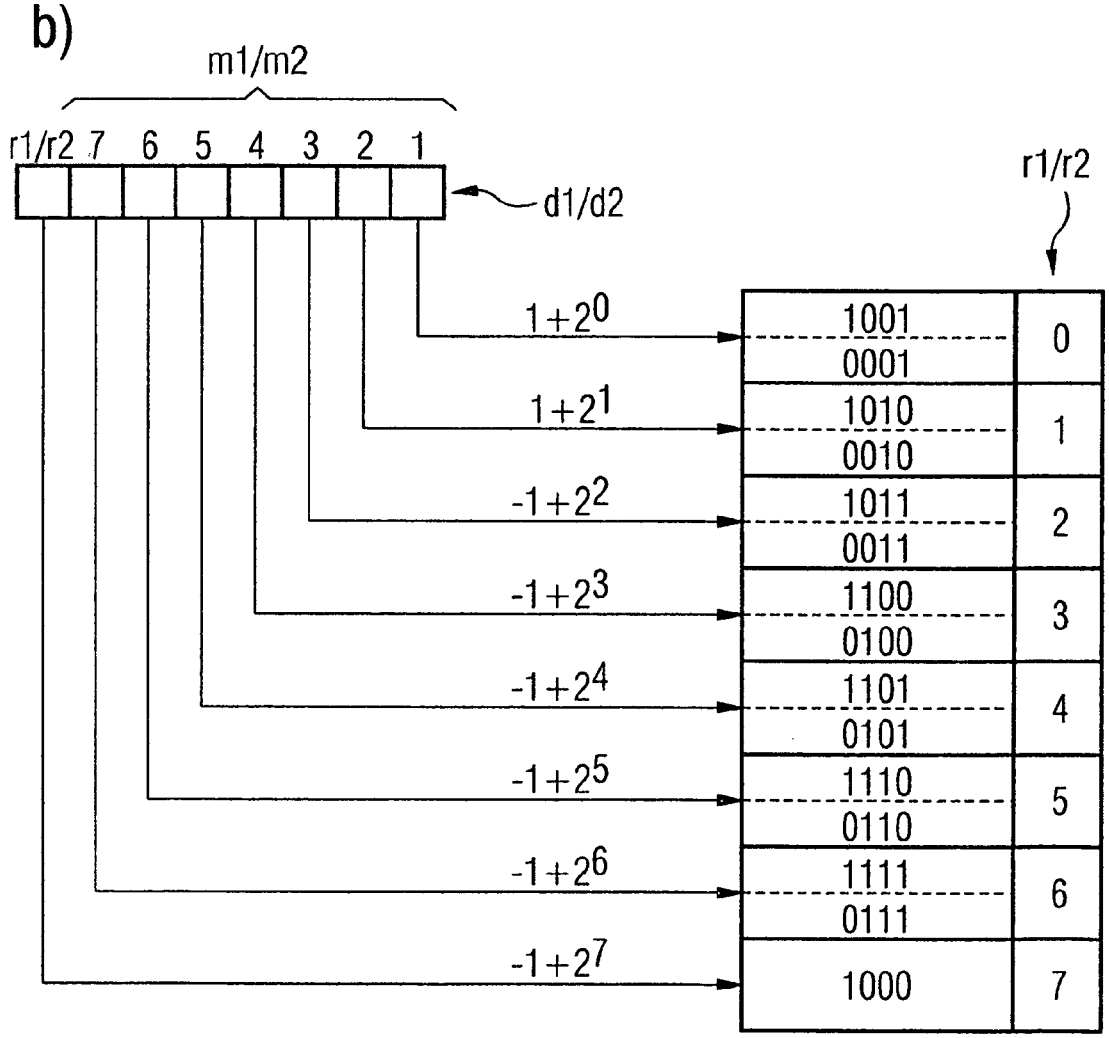

FIG 10
a)
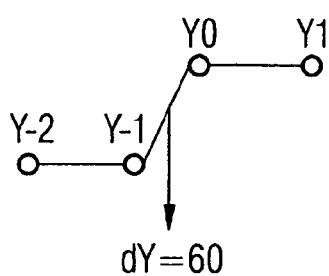
dY = 60
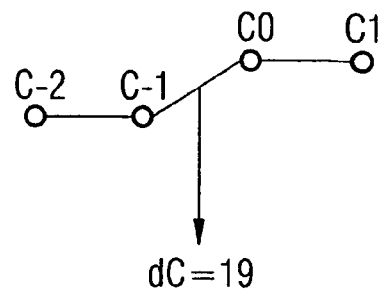
dC = 19
b)
| MSB-DPCM | | |
|---|---|---|
| -64 | 6 | 1111 |
| -32 | 5 | 1110 |
| -16 | 4 | 1101 |
| -8 | 3 | 1100 |
| -4 | 2 | 1011 |
| -2 | 1 | 1010 |
| -1 | 0 | 1001 |
| 0 | 0 | 0000 |
| +1 | 0 | 0001 |
| +2 | 1 | 0010 |
| +4 | 2 | 0011 |
| +8 | 3 | 0100 |
| +16 | 4 | 0101 |
| +32 | 5 | 0110 |
| +64 | 6 | 0111 |
| +/-128 | 7 | 1000 |
| MSB-DPCM | | |
|---|---|---|
| -64 | 6 | 1111 |
| -32 | 5 | 1110 |
| -16 | 4 | 1101 |
| -8 | 3 | 1100 |
| -4 | 2 | 1011 |
| -2 | 1 | 1010 |
| -1 | 0 | 1001 |
| 0 | 0 | 0000 |
| +1 | 0 | 0001 |
| +2 | 1 | 0010 |
| +4 | 2 | 0011 |
| +8 | 3 | 0100 |
| +16 | 4 | 0101 |
| +32 | 5 | 0110 |
| +64 | 6 | 0111 |
| +/-128 | 7 | 1000 |
c)
$d1 = dY = 60_{10} = 001\vdots111100_2$
$= dY' + 28_{10}$
$d2 = dC = 19_{10} = 0001\vdots0011_2$
$= dC' + 3_{10}$
$d3 = \underbrace{0110}_{dY'} \underbrace{0101}_{dC'} \; \underset{Y_4}{1} \; \underset{Y_3}{1} \; \underset{C_3}{0} \; \underset{Y_2}{1}$

| | | |
|---|---|---|
| -64 | 6 | 11101 |
| -48 | 4 | 11011 |
| -32 | 4 | 11001 |
| -24 | 3 | 10111 |
| -16 | 3 | 10101 |
| -12 | 2 | 10011 |
| -8 | 2 | 10001 |
| -4 | 2 | 0111 |
| -2 | 1 | 0101 |
| -1 | 0 | 0011 |
| 0 | 0 | 000 |
| +1 | 0 | 0010 |
| +2 | 1 | 0100 |
| +4 | 2 | 0110 |
| +8 | 2 | 10000 |
| +12 | 2 | 10010 |
| +16 | 3 | 10100 |
| +24 | 3 | 10110 |
| +32 | 4 | 11000 |
| +48 | 4 | 11010 |
| +64 | 6 | 11100 |
| ±128 | 7 | 1111 |

FIG 11a $$d1 = dY = 60_{10} = 48 + 12 \mathrel{\hat{=}} 11010 \,|\, 1100_2$$

$$d2 = dC = 19_{10} = 16 + 3 \mathrel{\hat{=}} 10100 \,|\, 011_2$$

$$d3 = \begin{array}{cccccccccc} 11010 & 10100 & 1 & 1 & 0 & 0 & 1 & 0 & 1 \\ dY' & dC' & Y3 & Y2 & C2 & Y1 & C1 & Y0 & C0 \end{array}$$

FIG 11b

| | | |
|---|---|---|
| +128 | 7 | 1111 |
| +112 | 4 | 0111 |
| +96 | 4 | 0110 |
| +88 | 3 | 0101 |
| +80 | 3 | 0100 |
| +72 | 3 | 0011 |
| +64 | 3 | 0010 |
| +32 | 5 | 0001 |
| 0 | 5 | 0000 |
| -32 | 5 | 1000 |
| -64 | 3 | 1001 |
| -72 | 3 | 1010 |
| -80 | 3 | 1011 |
| -88 | 3 | 1100 |
| -96 | 4 | 1101 |
| -112 | 4 | 1110 |
| -128 | 7 | 1111 |

FIG 12

METHOD FOR ENCODING A FIRST AND A SECOND DATA WORD

PRIORITY INFORMATION

This patent application claims priority from German patent application 10 2004 041 418.1 filed Aug. 26, 2004, which is hereby incorporated by reference.

BACKGROUND OF THE INVENTION

The present invention relates in general to video image processing and in particular to encoding two data words, each representing differential data values, such as differential luminance values and differential chrominance values.

In image processing, it is known to define individual pixels of an image in terms of several image information values, such as a luminance or brightness value and chrominance or color values. The transmission or storage of such images occurs in that the image information values of the individual pixels of the picture are oriented in a predetermined sequence within a serial data stream, which is saved in memory or transmitted. For pictures in the known YUV format, the individual pixels are assigned a Y-value as the luminance value and a U-value and a V-value as the chrominance values. The number of the Y, U, and V values assigned to a pixel vary according to the format utilized. In the 4:4:4 format, the same number of Y, U, and V values represent each image (i.e., one Y value, one U value and one V value is assigned to each pixel). In the 4:2:2 format, there are twice as many Y values as U and V values. In this format, the transmission or storage of the values of an image occurs as a serial data sequence in which every second data value transmitted is a Y value, followed alternately by a U value and a V value (e.g., Y1-U1-Y2-V1-Y3-U2 . . . ).

Various encoding methods are known for reducing the data transmission rate during the transmission of video or audio data. An example is the Difference Pulse Code Modulation (DPCM) method, which is described, for example, in Ohm, Jens-Rainer: "*Digital Image Encoding: Representation, Compression and Transmission*," Springer, 1995, ISBN 3-540,58579-6, pages 246 to 261.

In the DPCM method, instead of absolute values one quantizes and encodes differences of consecutive values of a data sequence. During the transmission of audio data or video data, small signal changes from one value to another typically occur more often than large signal changes in consecutive values, (e.g., in the values representing two consecutive brightness or color video data). Also, the eye is more tolerant when quantizing large signal changes as opposed to relatively smaller signal changes. Thus, large difference values are quantized more coarsely in the DPCM method, while smaller difference values are quantized more finely. The reduction of the transmission rate can be adjusted in terms of the desired precision of the quantization.

Referring to FIGS. 1a-1c, there illustrated is an example of the known DPCM method for encoding luminance and chrominance difference values. Each value can assume an amplitude between −255 and +255. For error-free encoding of these values, nine bits are utilized (one sign bit and eight data bits). To reduce the transmission rate, however, seven bits are made available for the luminance difference values (one sign bit and six data bits), and five bits for the chrominance difference values (one sign bit and four data bits). While this method of encoding reduces the transmission rate or transmission bandwidth, it may also result in a loss of information or errors.

The difference values listed in the tables of FIG. 1b are nonlinearly quantized. The quantization error becomes larger as the amplitude of the difference value being encoded increases. For the luminance difference values, six data bits are utilized. The encoding is performed for amplitude values between 0 and 10 in steps of one, and thus without quantization error. After an amplitude value of 10, the quantization occurs in steps of two, after an amplitude value of 44 in steps of four, and after an amplitude value of 128 in steps of eight. For example, to transmit a luminance difference value with an amplitude of 247, the value 240 is encoded and transmitted, resulting in a quantization error of 7. The encoding table of FIG. 1b for chrominance difference values provides four data bits for the transmission of chrominance difference values. As such, the quantization error for amplitude values above 128 is as much as 63, since after an amplitude value of 128 the quantization occurs in steps of 64.

The translation or encoding of a luminance difference value and a chrominance difference value using the DPCM method into an encoded data word with a length of twelve bits is illustrated in FIG. 1c for a luminance difference value dY=60 and a chrominance difference value dC=19. In addition to the two sign bits (e.g., the sign bit $Sgn_Y$ of the luminance difference value dY, and the sign bit $Sgn_C$ of the chrominance difference value), the code words dY' and dC' taken from the respective encoding tables of FIG. 1b are mapped onto the encoded data word being transmitted. In this example, the transmission of the luminance difference value dY occurs without quantization errors, since the luminance difference value dY=60 corresponds to an interval limit value (i.e., 60) indicated in the luminance encoding table of FIG. 1b. Since the chrominance difference value dC=19 lies between the limit values of 16 and 20 in the chrominance encoding table of FIG. 1b, the difference value dC'=16 is transmitted, resulting in a quantization error of 3.

A problem with the DPCM method, in which two video information values (e.g., one luminance difference value and one chrominance difference value) are mapped onto a common encoded data word, is that the quantization accuracy depends on the encoding tables used. As such, this method can be somewhat inflexible.

German patent application DE 100 07 171 describes a method for encoding several data words in a common encoded data word. In this method, for each data word the number of significant digits is determined and to each data word is assigned significance information depending on the number of these digits. The significance information is arranged in an encoded data word and the individual data bits of the data words are mapped onto the encoded data word.

What is needed is a method for encoding first and second data words that allows for relatively flexible encoding and smaller quantization errors from the encoding for at least certain value pairs of the first and second data words.

SUMMARY OF THE INVENTION

A method for encoding a first data word and a second data word, which may represent differential data values (e.g., luminance and chrominance difference data values related to image processing), onto an encoded data word includes the following steps:

Determining a first approximation value, to which a first code word is assigned, for a first data value, and determining a second approximation value, to which a second code word is assigned, for a second data value;

Mapping the first code word onto a first data segment of the encoded data word and mapping the second code word onto a second data segment of the encoded data word;

Determining a first difference value between the first data value and the first approximation value and determining a second difference value between the second data value and the second approximation value; and At least partial mapping of a first difference data word representing the first difference value and/or a second difference data word representing the second difference value onto at least one additional data segment of the encoded data word.

The first data value is represented by a first data word containing a number of data bits and the second data value is represented by a second data word containing a number of data bits. The first approximation value is formed in that a position is determined for the highest relevant data bit for the value of the first data word and the power of two is formed for this bit position. The second approximation value is formed in that a position is determined for the highest relevant data bit for the value of the second data word and the power of two is formed for this bit position.

Each data bit position of the first data word is assigned at least one first code word that is individual to this bit position, and each data bit position of the second data word is assigned at least one second code word that is individual to this bit position. Each bit position of the first data word is assigned a first sequence number and each bit position of the second data word is assigned a second sequence number.

The method may also include the following steps:

a) Determining the highest relevant bit position for the value of the first data word and mapping the first code word assigned to this bit position onto the first data segment of the encoded data word;

b) Determining the highest relevant bit position for the value of the second data word and mapping the second code word assigned to this bit position onto the second data segment of the encoded data word; and c) Mapping the data bit of at least one bit position of the first or second data word that is lower in terms of the highest relevant bit position onto the at least one additional data segment of the encoded data word.

The mapping of the data bit of at least one bit position lower than the highest relevant bit position corresponds to the mapping of the first and/or second difference data word onto the additional data segment of the encoded data word.

In this method, the sequence numbers of the highest relevant bit positions of the first and second data word are compared and depending on this comparison a data bit of the first or second data word is mapped onto the additional data segment. The sequence numbers of the individual bit positions can be chosen, for example, to depend on a quantization error that would occur if the information as to the highest relevant bit position were encoded and transmitted for the first and second data word. The next relevant data bit of the first and second data words for which the quantization error would be larger is the next one to be encoded.

The first and/or second data word can also contain a sign bit, besides the data bits. The sign bits can be mapped along with the first and second code words onto the encoded data word. Furthermore, the sign bit may be taken into account when generating the first and second code words that are mapped onto the encoded data word. Thus, each bit position of the first data word can be assigned two first code words and each bit position of the second data word can be assigned two second code words, each code word allowing for the bit position and the sign.

The encoded data word may contain, in addition to the first and second code words and possibly also the sign bits, several additional data segments to which data bits of the first and/or second data word are assigned, according to the following steps:

c1) Determining the sequence number of the bit position of the last data bit of the first data word that was mapped onto the encoded data word, and determining the sequence number of the last data bit of the second data word that was mapped onto the encoded data word;

c2) Comparing the sequence numbers;

c3) Selecting one of the first and second data words, depending on the comparison of the sequence numbers, and mapping a data bit from this selected data word onto the encoded data word; and c4) Repeating steps c1) to c3) until the data bits of the encoded data word are occupied.

Thus, the data word is selected whose data bit last mapped onto the encoded data word or whose most relevant one of the data bits mapped thus far onto the encoded data word has the higher sequence number. If the sequence numbers are identical, a data bit of a predetermined one of the two data words is mapped onto the additional data segment of the encoded data word. If the first and second data words being encoded are, for example, a data word representing a luminance value and a data word representing a chrominance value, then if the sequence numbers are the same a data bit of the luminance value is mapped onto the encoded data word to reduce the encoding error of the luminance value. This is based on the knowledge that encoding errors of the luminance value are more obvious to the viewer than encoding errors of the chrominance value and may therefore be reduced with a higher priority.

An encoding priority may be assigned to one of the first and second data words, while in step c3) the data word with the encoding priority may be selected to encode an additional data bit of this data word when the difference between the sequence numbers of the last data bit mapped from this data word and the last data bit mapped from the other data word is less than a given value.

The sequence numbers of the bit positions of the individual data words are chosen, for example, to depend on the number of the bit position and form an increasing number sequence starting with the least significant bit (LSB) of the particular data word.

The encoded data words may represent, for example, differential data values, for example a luminance difference value and a chrominance difference value.

The code words assigned to the individual bit positions of the first and second data words can be chosen so that they each contain the same number of code bits. The possibility also exists of selecting the code words so that the individual code words are of different length, and differing numbers of additional data segments are available for the encoding of additional data bits, depending on the most significant bit position of the individual data words being encoded.

These and other objects, features and advantages of the present invention will become more apparent in light of the following detailed description of preferred embodiments thereof, as illustrated in the accompanying drawings.

BRIEF DESCRIPTION OF THE DRAWINGS

FIGS. 1a-1c illustrate a known DPCM method for the encoding of two differential data words onto an encoded data word;

FIG. 4 illustrates an encoding table with second code words, each of them assigned to one bit position of the second data word;

FIG. 5 illustrates the encoding of a first and a second data word onto the encoded data word the encoding tables of FIGS. 3 and 4;

FIGS. 6a-6b illustrate the reconstruction of transmitted data words at the receiver side and the error resulting from the encoding;

FIGS. 8a-8c illustrate the encoding of signed first and second data words onto an encoded data word;

FIGS. 10a-10c illustrate an encoding of two differential data words onto an encoded data word;

FIGS. 11a-11b illustrate an encoding of two data words onto an encoded data word; and FIG. 12 illustrates a table with approximation values, their sequence numbers, and their assigned code word.

DETAILED DESCRIPTION OF THE INVENTION

Figure 2:
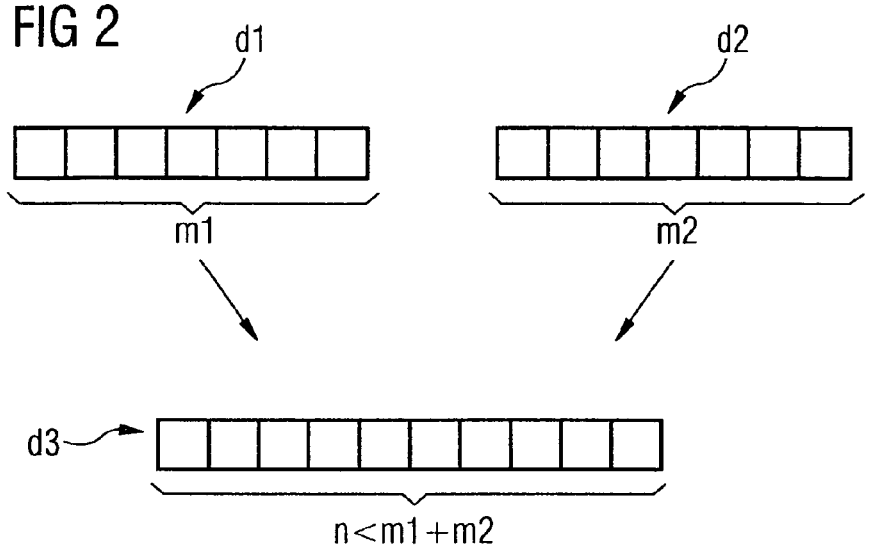
FIG. 2 illustrates a data length of a first and second data word and of an encoded data word.

Referring to FIG. 2, a first data value is represented by a first data word $d1$ with a first number $m1$ of data bits (i.e., word length), and a second data value is represented by a second data word $d2$ with a second number $m2$ of data bits. An encoded data word $d3$ has a word length $n$, and the word length $n$ of this encoded data word $d3$ may be smaller than the sum of the first and second word lengths $m1$, $m2$, so that $n<m1+m2$.

For the first and second word lengths, $m1=m2=7$. As such, the first and the second data word $d1$, $d2$ can each represent decimal values between 0 and 127 ($2^7-1$). The word length of the encoded data word $d3$ in the example is $n=10$.

Figure 3:
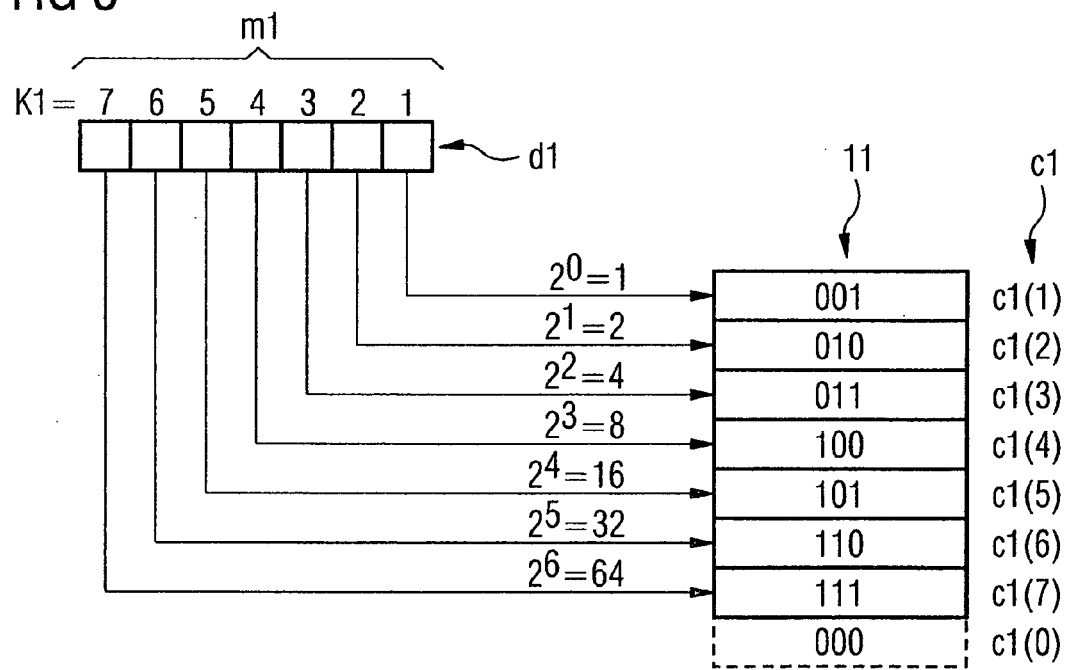
FIG. 3 illustrates an encoding table with first code words, each of them assigned to one bit position of the first data word.

Referring to FIG. 3, each of the seven bit positions $k1$ of the first data word $d1$ is associated with a first code word $c1$, which is stored in a first code table 11. FIG. 3 illustrates the associating of the individual first code words $c1(1)$ to $c1(7)$ with the individual bit positions. The first bit position, which comprises the least significant data bit (LSB) of the first data word $d1$, is associated with the first code word $c1(1)=001$. The individual code words comprise three data bits each and are chosen such that the numerical value of the binary code word corresponds each time to the bit position $k1$. The binary code words 001 to 111 may also be associated in any other manner with the individual bit positions. It suffices that each bit position $k1$ is associated by the encoding table 11 with an individual code word $c1$. FIG. 3 also illustrates the decimal value that is represented by the respective bit position of the first data word $d1$.

Referring to FIG. 4, each bit position $k2$ of the second data word $d2$ is associated with an individual code word $c2$, which is stored in a second encoding table 12. The second code words associated with the individual bit positions $k2$ of the second data word $d2$ correspond to the first code words $c1$ associated with the respective bit positions of the first data word $d1$. The second code words $c2$ of the individual bit positions $k2$ of the second data word $d2$ can also be chosen independently of the first code words $c1$ of the bit positions $k1$ of the first data word $d1$.

The method for encoding a first and a second data word $d1$, $d2$ using the coding tables of FIGS. 3 and 4 is illustrated in FIG. 5 for a first binary data word $d1=0111100$ and a second binary data word $d2=0010011$. In decimal notation, the first data word $d1$ corresponds to the value 60 and the second data word to the value 19.

The method approximates the data values represented by the data words using approximation values. For this, the most significant data bits are determined for the value of the first and second data words $d1$, $d2$.

Where the data bits are numbered 1 through 7 starting with the LSB (bit position 1) of data words $d1$, $d2$ and where the most significant bit (MSB) of the data words $d1$, $d2$ is bit position 7, the most significant data bits are the data bits $k1=6$ for the first data word $d1$ and $k2=5$ for the second data word $d2$. The higher valued data bits of these two data words $d1$, $d2$ (bit 7 for $d1$ and bits 6 and 7 for $d2$) are each 0 and thus provide no relevant component value to the values of the two data words $d1=0111100_2=60_{10}$ and $d2=0010011_2=19_{10}$.

The code words assigned to the bit positions of the most significant data bit position $k1=6$ and $k2=5$ are mapped onto first and second data segments of the encoded data word $d3$. The first code word $c1(6)=110$ assigned to the bit position $k1=6$ of the first data word $d1$ is taken from the first code table 11 (FIG. 3) and mapped onto the first data segment of the encoded data word $d3$, which contains the three bit positions $k3=8$ to $k3=10$ of the encoded data word $d3$. The second code word $c2(5)=101$ assigned to the bit position $k2=5$ of the second data word $d2$ is taken from the second code table 12 (FIG. 4) and mapped onto a second data segment of the encoded data word $d3$, which contains the bit positions $k3=5$ to $k3=7$.

The information contained in the encoded data word in the most significant data bit position in the first and second data word $d1$, $d2$ enables a first and second approximation, respectively, of the data values represented by the first and second data word $d1$, $d2$. The information contained in the first and second code word $c1(6)$, $c2(5)$ as to the most significant data bit in the first and second data word $d1$, $d2$ indicates that the first data word $d1$ has a value greater than or equal to $2^5=32$ and the second data word $d2$ has a value greater than or equal to $2^4=16$.

Generally, the approximation values for the first and second data value correspond to a power of two of the bit positions of the most significant data bits, when the bit positions are numbered such that bit position 0 is assigned to the LSB. The first approximation value for the first data value amounts to $2^{k1-1}=2^5=32$ and the second approximation value for the second data value amounts to $2^{k2-1}=2^4=16$.

For a further approximation of the data words $d1$, $d2$ being transmitted, additional bit positions are available, for example the bit positions $k3=1$ to $k3=4$ of the encoded data word $d3$. These are utilized to transmit information components of the first and second data word that may be of less significance than the information contained in the first and second data word $c1(6)$, $c2(5)$ as to the position of the most significant data bits. Each additional information component mapped onto the encoded data word $d3$ (e.g., each additional data bit of the first and second data word $d1$, $d2$) enables a relatively more precise approximation at the receiver side of the particular data word $d1$, $d2$ and reduces any error resulting from the encoding.

The mapping of additional data bits of the first and second data word $d1$, $d2$ onto the encoded data word $d3$ corresponds to an encoding of the differences between the particular data word and the approximation values represented by the first and second code word.

Where both the data words d1, d2 being transmitted and also the encoded data word d3 are each binary data words, individual data bits of the data words d1, d2 may be mapped directly onto the additional bit positions k3=1 to k3=4.

This mapping is performed with the goal of keeping the encoding error resulting from the data reduction from m1+m2=14 bits to n=10 bits as small as possible. Each bit position of the first and second data word d1, d2 is assigned a sequence number, which is a measure of how large the error would be if the values of all the next smaller positions starting from this particular bit position were not encoded. For example, these sequence numbers r1, r2 may correspond to the numbers of the particular bit positions. The sequence number of a given bit position is higher as the encoding error would be greater if all bit positions smaller than this given bit position were not encoded or were set at zero. If only the most significant data bit k1=6 of the first data word d1 were transmitted, corresponding to the first approximation of the value of the first data word d1, then if the bit positions k1=5 to k1=1 were disregarded or set at zero the relatively highest encoding error would be Emax1=$11111_2$=$31_{10}$. If only the bit position of the most significant bit k2=5 of the second data word d2 were transmitted, corresponding to the first approximation of the value of the second data word d2, the relatively highest encoding error would be Emax2=$1111_2$=$15_{10}$.

For mapping additional data bits of the first and second data word onto the additional bit positions of the encoded data word d3, the most significant data bit position of the first and second data word d1, d2 is determined whose data bit is being mapped onto the encoded data word d3. These are the bit positions of the most significant data bit, for example the bit position k1=6 of the first data word d1, to which the sequence number r1=6 is assigned, and the bit position k2=5 of the second data word d2, to which the sequence number r2=5 is assigned.

These sequence numbers r1=6 and r2=5 are compared to decide which of the two data words d1, d2 yields the first additional data bit for the bit position k3=4 of the encoded data word d3. The data bit for the additional bit position of the encoded data word d3 is selected from the first and second data words d1, d2 whose highest bit position already mapped onto the encoded data word has the higher sequence number. If the sequence numbers of the last encoded bit positions are equal, the data bit of the next smaller bit position of the first data word d1 is mapped onto the encoded data word d3.

After encoding of the bit positions k1=6 and k2=5 with sequence numbers r1=6 and r2=5 onto the first and second data segment of the encoded data word d3, the data bit d1(5) of bit position k1=5 of the first data word d1 is mapped onto the first additional bit position k3=4 of the encoded data word d3. After this step, the sequence number of the highest bit position of the first data word d1 already mapped onto the encoded data word d3 is r1=5, while r2=5 continues to hold. The next to be mapped onto the second additional bit position k3=3 of the encoded data word d3 is the data bit d1(4) of bit position k1=4 of the first data word d1. After this step, r1=4 and r2=5, so that in the next step the data bit d2(4) of the second data word d2 is mapped onto the third additional bit position k3=2 of the encoded data word d3. After this step, r1=4 and r2=4, so that in the next step a data bit is mapped from the first data word d1 (e.g., the data bit of the next significant bit position k1=3 after bit position k1=4, which is data bit d1(3)) onto the fourth additional bit position k3=1 of the encoded data word d3.

The remaining data bits at bit positions k1=2 and k1=1 of the first data word d1 and the remaining data bits of bit positions k2=3 to k2=1 of the second data word d2 are no longer used in the encoding. Thus, the error for the encoding is Emax1=$11_2$=$3_{10}$ for the first data word d1 and Emax2=$111_2$=$7_{10}$ for the second data word d2.

Referring to FIG. 5, data bits d1(6), d1(5), d1(4) and d1(3) from the first data word d1 are mapped onto the encoded data word d3 and transmitted. At the receiver side, referring to FIG. 6a, from these transmitted data bits one can reconstruct a sent data word d1'=$111100_2$=$60_{10}$. The data bits of the first data word d1 for which no information is transmitted may be set at 0. In the example, d1=d1'=60, so that no encoding error is present, as the two data bits d1(2), d1 (1) of the first data word d1 that were not transmitted are 0.

The data bits d2(5) and d2(4) are transmitted from the second data word d2, and the nontransmitted data bits d2(3), d2(2), and d2(1) are each set at 0. From this, the data word d2'=$10000_2$=$16_{10}$ can be reconstructed (FIG. 6b). The encoding error in this case is d2 to d2'=$011_2$=$3_{10}$, since the data bits d2'(2) and d2'(1) set at 0 during the reconstruction of the data word are not equal to the data bits d2(2), d2(1).

FIG. 7a illustrates another example of the encoding method for the transmission of a first data word d1=$110_2$=$6_{10}$ and a second data word d2=$10011_2$=$19_{10}$. The most significant data bit of the first data word d1 is the data bit at position k1=3, to which according to the table in FIG. 3 is assigned the first code word c1(3)=011, and which is mapped onto a first data segment of the encoded data word d3. The most significant bit of the second data word d2 is the data bit of position k2=5, to which according to the table of FIG. 3 is assigned the second code word c1(5)=101, and which is mapped onto the second data segment of the encoded data word d3.

After these steps, there exist the sequence numbers r1=3 for the bit position of the most significant data bit of the first data word d1 and r2=5 of the most significant data bit of the second data word d2. Next, the data bit of position k2=4 of the second data word d2 is mapped onto the first additional bit position of the third data word d3. Since the sequence number r1=4 of this data bit d2(4) most recently mapped from the second data word d2 is still higher than the sequence number of the highest bit position of the first data word d1 already mapped onto the encoded data word, in the next step one again encodes a data bit of the second data word, namely, the data bit d2(3) of position k2=3 of the second data bit d2. As a result, r1=3 for the sequence number of the highest bit position already encoded from the first data word d1 and r2=3 for the sequence number of the highest bit position already encoded from the second data word d2. Thus, the sequence numbers of the data bits most recently mapped from the respective data word d1, d2 onto the encoded data word d3 coincide. Next, the data bit d1(2) of position k1=2 of the first data word d1 is mapped onto the third additional data segment of the encoded data word d3. Onto the fourth additional data segment at bit position k3=1 of the encoded data word d3 is mapped the data bit d2(2) of position k2=2 of the second data word d2.

In this example, the data bits d1(3) and d1(2) are encoded from the first data word d1, so that after the transmission the result is, as illustrated in FIG. 7b, for the data word reconstructed from the encoded data word d1'=$110_2$=$6_{10}$. In this example, the four data bits d2(5) through d2(1) are transmitted from the second data word d2 (in contrast with three data bits for the example of FIGS. 5 and 6) with the result that the reconstructed data word d2'=$10010_2$=$18_{10}$. The encoding error in this case is 1.

Figure 7:
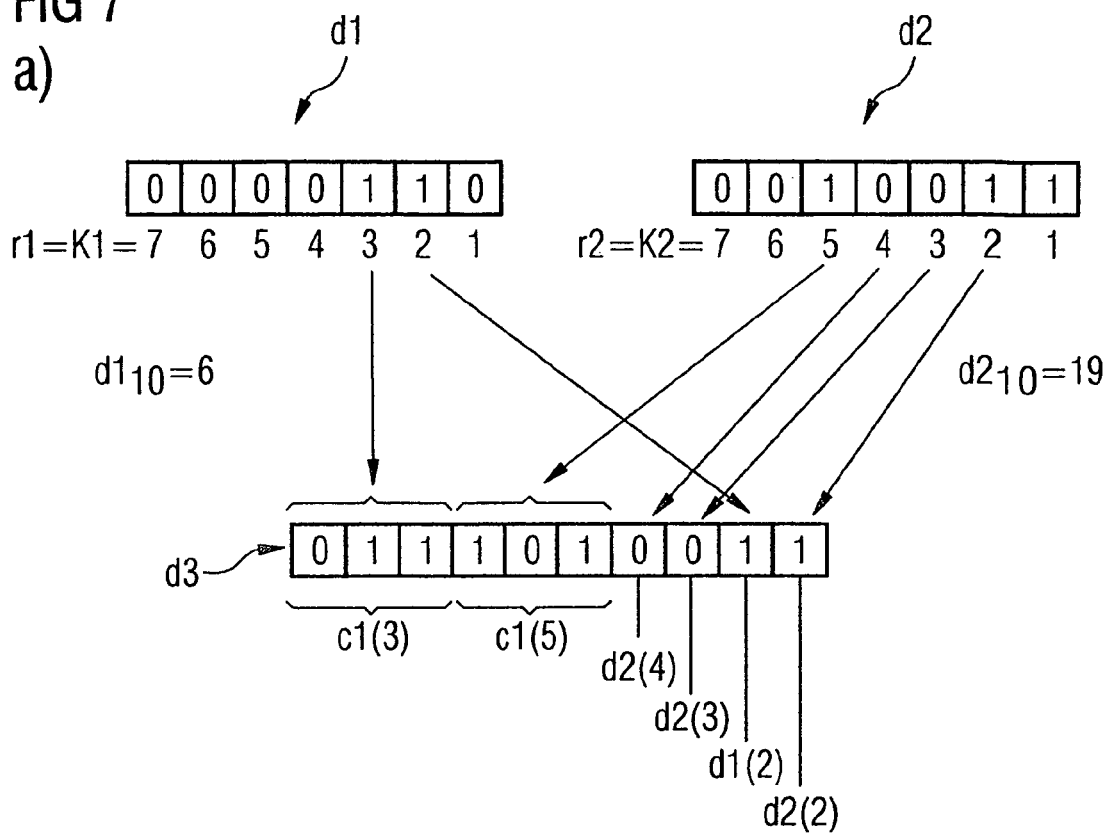
FIGS. 7a-7b illustrate another example of the encoding of two data words onto an encoded data word (FIG. 7a) and the reconstruction at the receiver side (FIG. 7b)

As the examples in FIGS. 5 through 7 illustrate, the encoding method does not use any strict association between the individual bit positions of the encoded data word and the individual bit positions of the two transmitted data words d1, d2. Instead, these bit positions are assigned adaptively, depending on the specific values being transmitted, among other things, and with the goal of keeping the encoding error as small as possible.

In the case when one of the two data words or both data words are 0 such that there is no most significant data bit position, a first or second code word is mapped onto the first or second data segment of the encoded data word. Referring to FIGS. 3 and 4, this code word is denoted c1(0) or c2(0) and has, for example, the value of $000_2$. This code word is assigned, for example, the sequence number 0, with the result that only data bits of the other respective data word are mapped onto the additional data segments of the encoded data word. If both data words are equal to 0, then for example an encoded data word d3 which likewise contains only zeroes will be transmitted.

When mapping the data bits of the first and second data word d1, d2 onto the encoded data word, if the LSB bits of the two data words d1, d2 are already mapped onto the encoded data word d3, then the data segments of the encoded data word d3 that may yet be available are filled in, for example, with zeroes.

The possibility also exists of transmitting signed data words, i.e., data words which contain an absolute value and a sign. In this case, additional bits are provided in the encoded data word besides the data bits for the absolute magnitude, and the sign bits of the first and second data words are then mapped onto these additional bits.

Furthermore, however, the possibility also exists of handling the sign in the first and second code words c1, c2 of the first and second data words d1, d2 associated with the individual bit positions. FIG. 8a illustrates a first data word d1 with a word length of eight bits, comprising a sign bit r1 and m1=7 data bits. Also illustrated is a second data word d2 with a length of eight bits, containing a sign bit r2 and m2=7 data bits. These two data words d1, d2 are mapped onto an encoded data word d3 with a 12 bit word length.

Referring to FIG. 8b, every bit position of the first and second data words d1, d2 is associated with two code words, i.e., every bit position of the first data word d1 is associated with two first code words and every bit position of the second data word d2 is associated with two second code words. This assumes that corresponding bit positions of the first and second data word are each associated with the same code words.

The code words associated with a bit position, for example, the code words 1001 and 0001 assigned to the first bit position, differ from each other in at least one bit position. Further, one of the code words represents the particular bit position and a positive sign of the particular data word and the other of the code words represents the particular bit position and a negative sign of the particular data word. In FIG. 8b, the code words assigned to a bit position differ at one bit position, for example, the MSB position of the code words. The code words assigned to a bit position can differ in any given manner. It suffices that, as with any encoding method, the code words assigned to the individual bit positions are known at the receiver side.

The table of FIG. 8b illustrates not only the code words associated with individual bit positions, but also the respective sequence numbers, corresponding in the example to the bit position minus 1. The table of FIG. 8b uses 14 of the $2^4=16$ code words which can be represented with four bits, to take into account the seven bit positions and the two different signs of the data word each time. In the example, the code words 0000 and 1000 are not used for the bit positions. The code word 0000 is used, for example, to encode a data word which contains only zeroes at its seven data bit positions and possibly at its sign bit position.

In general, with a code word of length k, the sign of a data word and one of $i=2^k-1$ positions of the most significant data bit can be transmitted. Thus, the code word is suitable for encoding the sign and the position of the most significant data bit for data values between $-(2^i-1) \ldots 2^i-1$.

With a data word d1, d2 containing seven data bits and one sign bit, decimal data values between −127 and +127 can be represented. To transmit the position of the most significant data bit of the seven data bits and the sign information, code words with four code bits are used, one code bit for the sign and three code bits for the position of the most significant data bit.

To transmit the position of the most significant data bit and the sign for data values between −255 and +255, code words with five code bits are used, one code bit for the sign and four code bits for the position of the most significant data bit.

Data values whose absolute value lies above a given value may be encoded, i.e., mapped onto the encoded data word, without sign information. This is suitable when transmitting, as the data values, difference values between two consecutive data values of a sequence, since for difference values lying above a given value the sign information can be reconstructed from previously transmitted data.

In FIGS. 8a-8b, where code words with four code bits are available, one transmits difference values with absolute values greater than or equal to 128 ($2^7$) without sign. The code word 1000 is used to transmit the information that the difference value being transmitted is greater than or equal to 128 in absolute magnitude, i.e., it lies in the interval [128, 255]. The transmission of the code word corresponds to a transmission of a sign-independent approximation value of 128. To transmit sign information an additional bit of the code word is required. If the transmission of a difference amplitude value greater than or equal to 128 for one of the first or second data words is identified at the receiver side, the sign information can be determined by previously transmitted information.

Figure 9:
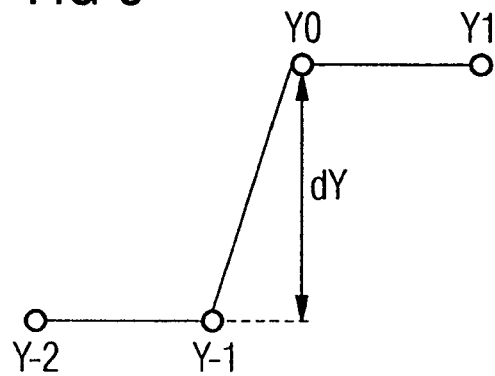
FIG. 9 illustrates a sequence of data values containing several consecutive data values.

The data values transmitted, which can lie between −255 and +255, represent differences between every two consecutive data values of a sequence, where absolute values of these data values lie between 0 and 255. FIG. 9 illustrates one such sequence with data values Y-2 . . . Y1. A difference value between a data value Y0 and a previous data value Y-1 is indicated as dY in FIG. 9.

To transmit a jump from value 0 of the first value Y-1 to a value 255 of the next value Y0, a difference value dY of +255 is encoded and transmitted, while for a jump from 255 to 0, a difference value dY of −255 is encoded and transmitted. The absolute values of the data sequence values are reconstructed at the receiver side by adding a received difference value to the absolute value determined immediately prior to this. Thus, to reconstruct the data value Y0, the sum of the value Y-1 and the difference value dY is formed.

If a sign-independent difference value dY greater than or equal to 128 is received, the value of the preceding absolute value Y-1 of the data sequence is determined. If this value lies in the interval [0, 128], the currently received difference value dY will be assumed to be a positive difference value. This is because negative difference value dY with an absolute magnitude greater than or equal to 128 when added to the previous absolute value Y-1 of the interval [0, 128] would result in an invalid current data value Y0 smaller than 0. On the other hand, if the previous value Y-1 lies in the interval [128, 255]

and a difference value greater than or equal to 128 is received, the difference value is assumed to be a negative difference value. This is because a positive difference value dY with a magnitude greater than or equal to 128 when added to the previous absolute value Y-1 of the interval [128, 255] would result in an invalid current data value Y0 greater than 255.

Difference values with a magnitude greater than 128 can be transmitted without sign, since the sign information can be reconstructed at the receiver side from the preceding value of the data sequence. Thus, difference values with a magnitude greater than 128 are transmitted without sign information.

Referring to FIGS. 10a-10c, an encoding method is illustrated for the encoding of two difference values dY, dC. These difference values dY, dC each represent a difference between a current data value and a preceding data value of two sequences Y-2 ... Y1 and C-2 ... C1. As numerical examples, FIGS. 10a-10c use $dY=60_{10}=00111100_2$ and $dC=19_{10}=00010011_2$.

In a first step, a first approximation is made for the difference value dY, dC being encoded, using the encoding table of FIG. 10b, in which approximation values are stored for the transmitted difference values. A code word is saved for each approximation value, for example, a code word having four bits. The approximation values are selected for the encoding tables of FIG. 10b to each be powers of two. Using the encoding table, the approximation value coming closest to the transmitted data value is selected, yet which is smaller in absolute magnitude than the data value being transmitted. The first approximation value dY'=32 is selected from the encoding table for the data value dY=60 being transmitted, which is associated with the code word 0110. For the data value dC=19 being transmitted, the first approximation value selected from the encoding table is dC'=16, which is associated with the code word 0101. Approximation values with magnitudes between 1 and 64 differ in terms of sign, while for difference values being transmitted with values greater than or equal to 128 the first approximation value is encoded and transmitted independently of sign.

The code words assigned to the first approximation values dY' and dC' are then mapped onto the encoded data word d3. The other data bits of the encoded data word d3 (e.g., four data bits) are used to represent and transmit as precisely as possible the difference between the data value being transmitted and the first approximation value. For the data value dY=60 and its first approximation value dY'=32, this difference equals $28_{10}=11100_2$. For the data value dC=19 and its first approximation value dC'=16, this difference equals $3_{10}=0011_2$.

The encoding of these differences, i.e., the mapping of the data bits of these differences onto the additional data bits of the encoded data word d3, is performed to reduce as much as possible the absolute error for the transmission of each data word. This is done by having data bits of the binary data words $11100_2$ and $0011_2$, which represent the difference values, be mapped onto the additional available bits of the encoded data word d3. The mapping is done to obtain an encoding error of the same size for both data values dY, dC. For this, in the example, the highest data bits $Y_4, Y_3, Y_2$ of the first difference value and the data bit $C_3$ of the second difference value are mapped onto the encoded data word. Of the first difference value, the data bits $Y_1$ and $Y_0$ of the first difference value and the data bits $C_2, C_1$ and $C_0$ of the second difference value are not considered. Thus, for the first data word an encoding error of $11_2=3_{10}$ results, and for the second data word, dC an encoding error of $111_2=8_{10}$ results.

Thus, one first makes a first approximation of the data word being transmitted dY, dC, and the approximation value, possibly including sign information, is encoded by a code word stored in an encoding table. A further consecutive approximation of the data values being transmitted dY, dC is performed by at least partial encoding of the remaining difference values, and the encoding error is greater according as more data bits of the difference value cannot be mapped onto the encoded data word.

Although the method has thus far been described for the mapping of a first and a second data word onto an encoded data word, the method is also suitable for mapping more than two data words onto an encoded data word.

Thus far as described, the encoded data word c3 has a given length each time. The possible encoding error resulting from the encoding of two data words onto the encoded data word will depend, for example, on the value of the first and second data word and any increases with increasing amplitude of the value represented by the particular data word.

To reduce the encoding error, the length of the encoded data word may be variable in configuration, since the number of additionally available data segments can vary. Thus, it is possible to provide for as many additional data segments in the encoded data word as will reliably encode the given data bits of the first data word d1 and the second data word d2.

Referring to FIG. 5, the encoding error of the first data word d1 with reference to FIG. 5 is $11_2=3_{10}$, while the error of the second data word d2 is $111_2=7_{10}$. So as not to let the encoding error for both data words d1, d2 become greater than $11_2=3_{10}$, data bits of these data words may be mapped until such time as the data bit at position k1=3 and k2=3 for both data words is encoded. To accomplish this, an additional encoding step is required in which the data bit d2(3) of the second data word d2 is mapped onto the encoded data word, illustrated by a dashed line in FIG. 5. The data word transmitted in this case then has a length of 11 bits.

A "no-loss encoding" can then be achieved if the mapping of the data bits of data words d1, d2 onto the encoded data word d3 is continued until the LSB of both data words, bit d1(1) and bit d2(1), is mapped onto the encoded data word.

An allowable encoding error for the first and second data word d1, d2 can also be chosen to be different.

As described, the approximation values are chosen each time to be a power of two of the bit position of the most significant bit, i.e., $dC'=2^{MSB}$ or $dY'=2^{MSB}$. Here, MSB denotes the bit position of the particular most significant bit, assuming MSB=0 for the least significant bit. However, powers of 2 as approximation values are not required, but instead other approximation values can be used, as explained hereinafter with respect to FIG. 11.

FIG. 11a illustrates an encoding table which has in the left column approximation values, in the middle column sequence numbers of the individual approximation values, and in the right column the code words assigned to the individual approximation values. The approximation values contained in this table differ from the approximation values given in the table of FIG. 10b in that there are approximation values such as ±12, ±24, ±48 which are not integer powers of the number 2. The individual approximation values are chosen such that the differences between the approximation value and the next larger or smaller approximation value are whole powers of the number 2 each time. Thus, for example, for the difference between the approximation value 32 and the next larger approximation value 48, the result is $48-32=16=2^4$. This technique of selecting the differences between the individual approximation values as whole powers of the number 2 achieves effective encoding, but it is not necessary. Neither is it necessary that the approximation values in the table are whole powers of the number 2. The use of the table in FIG. 11a is explained hereinbelow for an encoding of the data values dY=60 and dC=19.

For each of the data values dY, dC being encoded, the table is used to determine the approximation value corresponding to the particular data value or one which is smaller in magnitude than the particular data value and differs by magnitude at least from the particular data value as compared to the other approximation values. For the data value dY=60, this results in a first approximation value 48, which is assigned the code word dY'=11010. For a first difference between the first data value and the first approximation value, the result is 60−48=12=$1100_2$. The binary representation 1100 of this difference is designated hereinbelow as the first difference data word.

For the data value dC=19, a second approximation value equals 16, which is assigned the code word dC'=10100. The difference between the second data value dC and the first approximation value is 19−16=3=$011_2$. The binary representation 011 of this difference is designated hereinbelow as the second difference data word.

Each of the approximation values of the encoding table is assigned a sequence number. These sequence numbers are each a whole number in the example and depend on the allowable size of an error which can occur during approximation of a data value by an approximation value. This allowable error corresponds to the magnitude of the difference between the particular approximation value and the next higher approximation value minus one. For the first approximation value 48, whose next higher approximation value is the approximation value 64, the allowable error is 15 (64−48−1). For the second approximation value 16, whose next higher approximation value in the table is the approximation value 24, the allowable error is 7 (24−16−1).

The sequence number for an approximation value can correspond to this allowable error. However, the sequence number may depend on how the difference between the determined approximation value and the data value is mapped onto the encoded data word.

The difference between the approximation value and the data value is represented as a binary data word and individual data bits of this data word are mapped onto the encoded data word, starting with the data bit of the most significant bit position and taking into account conditions yet to be explained. The sequence number of an approximation value then corresponds to the number of bit positions required for a binary representation of the allowable error assigned to the approximation value. For the first approximation value 48 with its assigned allowable error of 15, the sequence number 4 results, and for the second approximation value 16 with its assigned allowable error 7 the sequence number 3 results. In general, the sequence number r can be represented as:

$$r = rd(ld(Emax)) \quad \text{(Eq. 1)}$$

Where ld(.) designates the function of the base 2 logarithm, Emax designates the maximum error assigned to an approximation value, and rd(.) designates a rounding function, which rounds a numerical value up to the next higher integer value, i.e., an integer value is increased by one and a noninteger value is rounded up to the next higher integer value.

The approximation values are chosen such that the differences between several neighboring approximation values are each the same magnitude, so that the same sequence numbers r are assigned to several approximation values. The sequence number 7 of the approximation value ±128 results from the magnitude of the difference (127) from the largest possible data value ±255, requiring seven bit positions for its representation.

The table of approximation values is generated so that it depends on signal statistics for the data values being transmitted, in that more approximation values or approximation values with smaller intervals from neighboring approximation values are generated for ranges of values in which the data values being transmitted occur more frequently than for other ranges of values.

Referring to FIG. 11a, for an encoding of signed values the approximation values are chosen to be "symmetrical" to zero, so that there is a negative approximation value of the same magnitude present for each positive approximation value.

The code words assigned to the first approximation value and to the at least one second approximation value are mapped onto the encoded data word. Taking into account the sequence numbers of the approximation values, the differences are encoded between the particular data value and the approximation value determined for the particular data value. This can be done in that these differences are represented as binary data words, and individual data bits of these data words are mapped onto the encoded data word. The number of bit positions of such a difference data word, representing a difference between a data value and an approximation value, will correspond to the number of bit positions needed to represent in binary notation the allowable error assigned to the approximation value. When determining the sequence number according to Equation 1, the number of bit positions of a data word, representing a difference between a data value and an approximation value, corresponds to the sequence number of the approximation value.

At first, the sequence numbers of the corresponding approximation value are assigned to the difference data words, each of them representing a difference between a data value and an approximation value. The mapping of the data bits of these difference data words is then done depending on the sequence number. Thus, the most significant data bit of the difference data word whose approximation value has the highest sequence number is first mapped onto the encoded data word. The sequence number of the difference data word whose data bit has been mapped is then reduced by a given value, for example 1. In the event of equal sequence numbers, it is established in advance which difference data word is to receive preference, i.e., from which difference data word a data bit will be mapped onto the encoded data word.

For the mapping of the next data bit, once again the sequence numbers of the difference data words are determined and the most significant data bit of the difference data word with the highest sequence number is mapped onto the encoded data word.

As this relates to an encoding of the values dY=60 and dC=19 using the table in FIG. 11a, this means that because of the larger sequence number of the first approximation value dY', the most significant data bit $Y_3=1$ of the first difference value or the first difference data word $1100_2$ is first mapped. This difference data word has sequence number 4, and the most significant data bit mapped has bit position 4. Remaining behind after the mapping is the difference data word $100_2$ with sequence number 3 (4−1), which corresponds to the number of bit positions. Assuming that when there is an equal number of bit positions of the difference data words yet to be encoded, the difference data word of the value dY is given preference for encoding, the next to be mapped is the data bit $Y_2=1$ of the difference value $1100_2$, which has bit position 3. The remaining difference data word $00_2$ is given the sequence number 2. There now remain the difference data word $00_2$ of dY with sequence number 3 or with two bit positions and the difference data word $100_2$ of dC with sequence number 3 or with three bit positions, so that the next to be encoded is the bit in the highest bit position of this value $100_2$.

This procedure for encoding the difference values between the data value being encoded and the particular approximation value is continued until one of the above explained conditions is reached, i.e., until all the data bits of the differences have been mapped, or a given number of data bits of the encoded word is reached or a minimum encoding error is attained for each data value. Assuming the final condition that all the data bits of the first and second data values are encoded, the encoding method is illustrated in FIG. 11b.

The possibility also exists of assigning an encoding priority to one of the data words being encoded or one of the difference data words being encoded after the encoding of the approximation value and selecting the prioritized difference data word when comparing the sequence numbers and encoding its respective data bit for as long as its sequence number is less than a given value above the sequence number of the at least one other difference data word.

Referring to the table in FIG. 11a, the individual approximation values can be chosen so that the allowable error remains the same with increasing magnitude of the approximation values or increases, which is similar to the difference from the next higher approximation value remaining the same or increasing with increasing magnitudes of the approximation values.

However, the possibility also exists of the intervals between individual approximation values becoming smaller as the approximation values grow larger.

Furthermore, the possibility exists of selecting the interval between individual approximation values of a group with at least two approximation values to be smaller than the interval between the smallest approximation value of this group in terms of magnitude and the next smaller approximation value and the interval between the largest of the approximation values of this group in terms of magnitude and the next largest approximation value. This procedure is useful when it is expected that the data values being encoded often take on values which lie in the range of the approximation values of this group. Such values are approximated with a small error already in the first step of the method when an approximation value is selected from the table. FIG. 12 illustrates a table of an example of such a sequence with approximation values. In the left column are the approximation values (0, ±32, ±64, ±80, ±96, ±112, ±144), in the middle column the assigned sequence numbers, and in the right column the code words assigned to the approximation values, each of which are unique for the individual approximation values.

The table contains a group of four approximation values ±64, ±72, ±80, ±88, every two neighboring ones being different by 8 and assigned the sequence number 3. The interval, i.e., the magnitude of the difference between the smallest approximation value ±64 in terms of magnitude and the next smallest approximation value ±32 is 32, which is similar to this next smallest approximation value ±32 having sequence number 5. The interval between the next higher approximation value ±96 belonging to this group and its larger approximation value ±112 in terms of magnitude is 16, so that this approximation value ±96 has sequence number 4.

This choice of approximation values is useful when it is expected that the magnitudes of the data values being encoded will often taken on values in the range between 64 and 88.

As described, the first code words which are associated with the bit positions of the first data word each have the same word length, and the first code words associated with the bit positions of the second data word each have the same word length. However, the first and/or second code words may be selected to have a different word length. The code words associated with the individual bit positions may be chosen as a function of the frequency with which the individual bit positions are occupied by the most significant bit of a data word. Bit positions which form the most significant position more often than other bit positions are assigned to shorter code words than the other bit positions, so as to obtain a shorter encoded data word for the encoding of frequently occurring data words. Such a procedure of using code words of different length for the transmission of information depending on the probability of occurrence of the information being transmitted is described, for example, in Proakis, John G.: "*Digital Communications*", 3rd. Ed., Mc Graw-Hill, ISBN 0-07-051726-6, pages 95 to 103. This type of encoding is known as variable length encoding.

Various encoding tables have been explained for the encoding of the most significant signal component. However, the possibility also exists of providing different encoding tables and selecting one of them according to the signal statistics, e., according to the frequency of occurrence of certain values being encoded in the signal sequence.

Furthermore, the method is not limited to the encoding of two data values, but rather can be used for any given number of data values being encoded. When encoding the difference data words, one must determine which of the difference data words will be encoded with preference when the sequence numbers are the same.

The method for decoding, at the receiver side, an encoded data word produced by the method, which has at least a first data segment, a second data segment, and at least one additional data segment, to obtain a first and a second decoded data word, emerges directly from the encoding algorithm. Data words decoded at the receiver side are reconstructed from the transmitted approximation values and the data bits of the difference data words.

Although the present invention has been shown and described with respect to several preferred embodiments thereof, various changes, omissions and additions to the form and detail thereof, may be made therein, without departing from the spirit and scope of the invention.

What is claimed is:

1. A method for encoding a first data word and a second data word onto an encoded data word, the first and second data words each having a number of bits and each being representative of at least one type of image data, the method comprising the steps of: determining a first approximation value, to which a first code word is assigned, for a first data value represented by the first data word, and determining a second approximation value, to which a second code word is assigned, for a second data value represented by the second data word; mapping the first code word onto a first data segment of the encoded data word and mapping the second code word onto a second data segment of the encoded data word; determining a first difference value between the first data value and the first approximation value and determining a second difference value between the second data value and the second approximation value; and at least partial mapping one of a first difference data word and a second difference data word onto at least one additional data segment of the encoded data word, where the first difference data word represents the first difference value and the second difference data word represents the second difference value, where each of the plurality of approximation values is associated with a sequence number, and where a magnitude of each of the corresponding plurality of sequence numbers depends on an absolute value of the difference in magnitude between two successive approximation values within the plurality of approximation values.

2. The method of claim 1, where the step of determining a first approximation value selects an approximation value from among a plurality of approximation values having a value that is smaller than the first data value and is the closest in magnitude from the first data value as compared to other approximation values within the plurality of approximation values.

3. The method of claim 1, where the step of determining a second approximation value selects an approximation value from among a plurality of approximation values having a value that is smaller than the second data value and is the closest in magnitude from the second data value as compared to other approximation values within the plurality of approximation values.

4. The method of claim 1, where each of the plurality of approximation values differs from one another by a power of the number 2.

5. The method of claim 1, where the magnitude of each one of the sequence numbers becomes larger as the absolute value of the difference in magnitude between two successive approximation values becomes larger.

6. The method of claim 1, where each one of the plurality of sequence numbers corresponds to the number of bit positions required to represent the absolute value of the difference in magnitude of two successive approximation values as a binary data word.

7. The method of claim 5, where a group of at least two approximation values exists in the plurality of approximation values, each approximation values within the group is at an interval from the next higher approximation value in the group in magnitude, where the interval is smaller than an interval between the smallest of the approximation values of the group in magnitude and smaller than an interval between the next higher approximation value in the group and the next higher approximation value to this approximation value in magnitude.

8. The method of claim 1, further comprising the step of comparing the sequence numbers of the approximation values and mapping a data bit of one of the first data word and the second data word onto the at least one additional data segment.

9. The method of claim 1, where the first difference data word is assigned the sequence number of the first approximation value and the second difference data word is assigned the sequence number of the second approximation value, the method further comprising the steps of: a) comparing the sequence numbers of the first and second difference data word; b) selecting one of the first and second difference data word depending on a result of the comparison; and c) mapping the data bit of a most significant data bit position of the difference data word chosen in step b) onto a bit position of the at least one additional data segment.

10. The method of claim 9, further comprising the steps of:
d) reducing the sequence number of the selected difference data word by a predetermined value and forming of a new difference data word from the selected data word by deleting the most significant data bit position of the selected difference data word; and e) repeating steps a) to d) until a final condition is achieved.

11. The method of claim 10, where the sequence number comprises a whole number and where the predetermined value for reducing the sequence number comprises one.

12. The method of claim 9, where the step of b) selecting selects the difference data word with the smallest sequence number.

13. The method of claim 12, where the step of b) selecting selects one of the difference data words depending on a predetermined criterion at least two difference data words each has the smallest sequence number.

14. The method of claim 10, where one of the difference data words is assigned an encoding priority, and where during step b) one of the difference data words with the encoding priority is selected where the difference between the sequence number of the difference data word with the encoding priority and the next smaller sequence number is less than a predetermined value.

15. The method of claim 10, where the final condition is achieved when all of the data bits of the at least one additional segment are occupied as a result of step c).

16. The method of claim 10, where the final condition is achieved when an encoding error is lower than a predetermined threshold for at least one of the first and second data word.

17. The method of claim 10, where the final condition is achieved when all of the data bits of one of the first and second data word are mapped onto the at least one additional data segment.

18. The method of claim 1, where the first and second data word each represents a differential data value.

19. The method of claim 1, where the first and second data word each represents video information values of a pixel.

20. The method of claim 1, where the one of the first and second data word represents a differential luminance value and the other of the first and second data word represents a differential chrominance value.

21. The method of claim 1, where the first data word and the second data word comprise a different numbers of data bits.

22. The method of claim 1, where the first code word and the second code word each has the same number of bits.

23. The method of claim 1, where the first code word and the second code word each has a different number of bits.

24. A method for encoding a first data word and a second data word onto an encoded data word, the first and second data words each representing at least one type of image data from among a luminance value and a chrominance value, the first and second data words each having a number of data bits, the method comprising the steps of: determining a first approximation value for a first data value represented by the first data word;
assigning a first code word to the first approximation value;
determining a second approximation value for a second data value represented by the second data word;
assigning a second code word to the second approximation value; mapping the first code word onto a first data segment of the encoded data word;
mapping the second code word onto a second data segment of the encoded data word; determining a first difference value between the first data value and the first approximation value;
determining a second difference value between the second data value and the second approximation value; and
mapping one of a first difference data word and a second difference data word onto at least one additional data segment of the encoded data word, where the first difference data word represents the first difference value and the second difference data word represents the second difference value;

where a sum of the number of data bits of the first data word and the number of data bits of the second data word is greater than a number of data bits of the encoded data word, where each of the plurality of approximation values is associated with a sequence number, and where a magnitude of each of the corresponding plurality of sequence numbers depends on an absolute value of the difference in magnitude between two successive approximation values within the plurality of approximation values.

25. The method of claim 24, where the step of determining a first approximation value determines a highest relevant data bit for the first data word and forms a power of two therefore, and where the step of determining a second approximation value determines a highest relevant data bit for the second data word and forms a power of two therefore.

26. The method of claim 24, further comprising the step of assigning a first sequence number to each bit position of the first data word, and the step of assigning a second sequence number to each bit position of the second data word.

27. The method of claim 24, further comprising the steps of:
c1) determining a sequence number of the bit position of the last data bit of the first data word that was mapped onto the encoded data word by the step of mapping the first code word, and determining a sequence number of the last data bit of the second data word that was mapped onto the encoded data word by the step of mapping the second code word;
c2) comparing the determined sequence numbers;
c3) selecting one of the first and second data words, depending on the comparison of the sequence numbers, and mapping a data bit from this selected one of the first and second data words onto the encoded data word; and
c4) repeating steps c1) to c3) until all of the data bits of the encoded data word are mapped.

28. The method of claim 24, where each of the first and second data words represent differential data values.

29. The method of claim 24, where one of the first and second data words represents a differential luminance value, and where the other one of the first and second data words represents a differential chrominance value.

30. The method of claim 1, where the first approximation value corresponds to a most significant data bit of the first data word, and the second approximation value corresponds to a most significant data bit of the second data word.

31. The method of claim 1, where a sum of the number of data bits of the first data word and the number of data bits of the second data word is greater than a number of data bits of the encoded data word.

* * * * *